United States Patent
Shi et al.

(10) Patent No.: US 11,125,844 B2
(45) Date of Patent: Sep. 21, 2021

(54) DEEP LEARNING BASED METHODS TO ACCELERATE MULTI-SPECTRAL IMAGING

(71) Applicant: The Board of Trustees of the Leland Stanford Junior University, Stanford, CA (US)

(72) Inventors: Xinwei Shi, Mountain View, CA (US); Brian A. Hargreaves, Menlo Park, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 16/451,396

(22) Filed: Jun. 25, 2019

(65) Prior Publication Data

US 2020/0011951 A1 Jan. 9, 2020

Related U.S. Application Data (60) Provisional application No. 62/694,549, filed on Jul. 6, 2018.

(51) Int. Cl.
*G01R 33/56* (2006.01)
*G01R 33/565* (2006.01)
*G01R 33/561* (2006.01)

(52) U.S. Cl.
CPC ...... *G01R 33/5608* (2013.01); *G01R 33/5611* (2013.01); *G01R 33/56545* (2013.01)

(58) Field of Classification Search
CPC ............ G01R 33/5608; G01R 33/5611; G01R 33/56545
See application file for complete search history.

(56) References Cited

U.S. PATENT DOCUMENTS

| | | | |
|---|---|---|---|
| 7,928,729 B2 | 4/2011 | Hargreaves | |
| 8,274,286 B2 | 9/2012 | Koch | |
| 10,203,394 B2 | 2/2019 | Jurrissen et al. | |
| 2016/0162782 A1* | 6/2016 | Park | G06N 3/082 706/17 |
| 2017/0309019 A1 | 10/2017 | Knoll | |
| 2018/0259608 A1* | 9/2018 | Golden | G01R 33/5608 |
| 2019/0167203 A1* | 6/2019 | Paul | G01R 33/543 |

OTHER PUBLICATIONS

Beck et al., A Fast Iterative Shrinkage-Thresholding Algorithm for Linear Inverse Problems. SIAM J. Imaging Sci., vol. 2, Issue 1 (2009), 183-202.

(Continued)

*Primary Examiner* — Gregory H Curran
(74) *Attorney, Agent, or Firm* — Lumen Patent Firm (57) ABSTRACT

A method for magnetic resonance imaging reconstructs images that have reduced under-sampling artifacts from highly accelerated multi-spectral imaging acquisitions. The method includes performing by a magnetic resonance imaging (MRI) apparatus an accelerated multi-spectral imaging (MSI) acquisition within a field of view of the MRI apparatus, where the sampling trajectories of different spectral bins in the acquisition are different; and reconstructing bin images using neural network priors learned from training data as regularization to reduce under-sampling artifacts.

5 Claims, 5 Drawing Sheets

(56) References Cited

OTHER PUBLICATIONS

Kevin M. Koch et al. A Multispectral Three-Dimensional Acquisition Technique for Imaging Near Metal Implants. Magnetic Resonance in Medicine 61:381-390 (2009).
Kevin M. Koch et al. Imaging Near Metal with a MAVRIC-SEMAC Hybrid. Magnetic Resonance in Medicine 65:71-82 (2011).
Lu et al. SEMAC: Slice Encoding for Metal Artifact Correction in MRI. Magnetic Resonance in Medicine 62:66-76 (2009).
Diamond et al. Unrolled Optimization with Deep Priors. arXiv:1705.08041v2 [cs.Cv]. Dec. 18, 2018.

\* cited by examiner

DEEP LEARNING BASED METHODS TO ACCELERATE MULTI-SPECTRAL IMAGING

CROSS-REFERENCE TO RELATED APPLICATIONS

This application claims priority from U.S. Provisional Patent Application 62/694,549 filed Jul. 6, 2018, which is incorporated herein by reference.

STATEMENT REGARDING FEDERALLY SPONSORED RESEARCH OR DEVELOPMENT

This invention was made with Government support under contract EB015891, EB019723, and EB017739 awarded by the National Institutes of Health. The Government has certain rights in the invention.

FIELD OF THE INVENTION

The present invention relates generally to magnetic resonance imaging (MRI). More specifically, it relates to multi-spectral imaging techniques in MRI and techniques for reducing metal-induced imaging artifacts.

BACKGROUND OF THE INVENTION

Metallic implants can cause substantial image artifacts in magnetic resonance imaging (MRI). Susceptibility variations between metal and surrounding tissue cause significant localized variations in the static magnetic field. These magnetic field variations then cause large resonant frequency variations and significant dephasing of the signal. These effects result in MRI imaging artifacts near the metal, including signal loss, failure of fat suppression, geometric distortion, and bright pile-up artifacts.

Multi-Spectral Imaging (MSI) techniques, including SEMAC (1), MAVRIC (2) and MAVRIC-SL (3), resolve most metal-induced artifacts by acquiring separate 3D spatial encodings for multiple spectral bins, at the cost of increased scan time. Various methods have been explored to accelerate MSI by exploiting correlations between spectral bins (4-6). Model-based reconstruction (5) and Robust PCA (RPCA) (6) explicitly or implicitly model spectral bin images as the same underlying magnetization modulated by different RF excitation profiles. They can provide around 20-fold acceleration when combined with parallel imaging (PI) and partial Fourier reconstruction (PF). However, they require long reconstruction times due to computationally expensive iterations.

BRIEF SUMMARY OF THE INVENTION

The present invention provides a computationally efficient deep-learning (DL)-based technique to accelerate MSI that uses unrolled optimization (7) with 3D convolutional neural network (CNN) priors. The unrolled optimization framework integrates PI and PF with 3D-CNN priors, which are trained to suppress under-sampling artifacts in the spatial-spectral domain. The 3D-CNN priors effectively exploit the correlations between spectral bin images and the complementary under-sampling patterns of spectral bins to suppress under-sampling artifacts. The above components allow this DL-based reconstruction technique to have shorter computation time and improved image quality compared with previous methods such as bin-by-bin compressed sensing (CS) and RPCA.

The techniques of the present invention may be implemented using a conventional MRI apparatus. According to embodiments of the present invention, the MRI apparatus is operated to perform image acquisitions in coordination with RF excitation sequences to produce image data. The MRI apparatus then processes the acquired image data to reconstruct an image. The reconstruction technique uses, in part, an unrolled optimization technique for solving the reconstruction problem of multi-spectral imaging techniques (see Eq. 3-4). Significantly, a unique prior neural network design is used in the implementation of the unrolled optimization.

In one aspect, the invention provides a method for magnetic resonance imaging that reconstructs images that have reduced under-sampling artifacts from highly accelerated multi-spectral imaging acquisitions. The method includes performing by a magnetic resonance imaging (MRI) apparatus an accelerated multi-spectral imaging (MSI) acquisition within a field of view of the MRI apparatus, where the sampling trajectories of different spectral bins in the acquisition are different; and reconstructing bin images using neural network priors learned from training data as regularization to reduce under-sampling artifacts. Preferably, an unrolled optimization algorithm is used to incorporate the neural network priors as regularization. The optimization algorithm preferably has variations including Iterative Shrinkage-Thresholding Algorithm (ISTA), the alternating direction method of multipliers (ADMM) and the gradient descent algorithm. The optimization problem preferably uses parallel imaging (PI) methods that require coil sensitivity calibration (for example, SENSE and GRAPPA) or do not need coil sensitivity calibration (for example, CLEAR).

Preferably, trainable networks are used as the proximal operator or the gradient of the prior term in the iterative optimization algorithm. The trainable networks may be neural networks with convolutions along spatial and spectral dimensions. Preferably, 3D convolutional neural networks (CNN) are used as the neural networks.

The MSI acquisition may have variations including MAVRIC, MAVRIC-SL, SEMAC and 2D MSI.

DETAILED DESCRIPTION OF THE INVENTION

Figure 1:
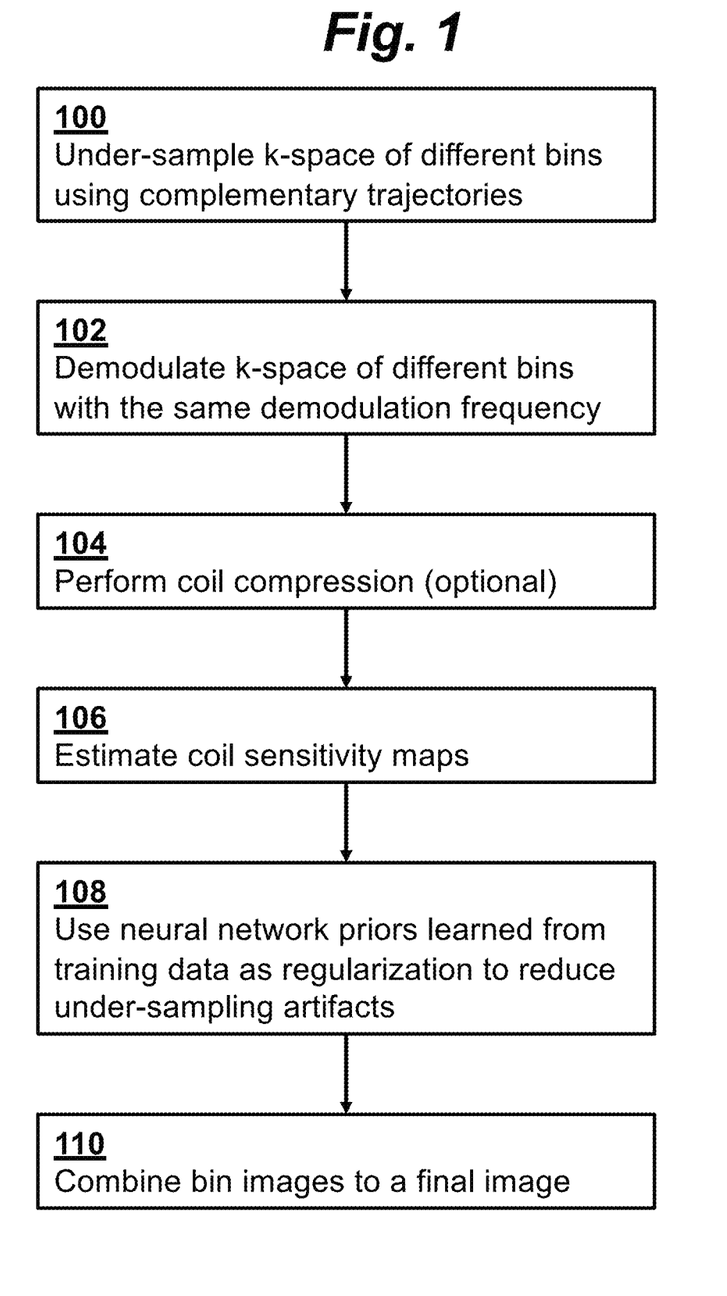
FIG. 1 is a flowchart of a method of deep-learning based reconstruction for multi-spectral imaging (MSI), according to an embodiment of the invention.

In embodiment of the invention, an overview of the technique is illustrated in the flowchart in FIG. 1. Step 100: During data acquisition, the k-space data of spectral bins are under-sampled following a complementary Poisson-disc (CPD) sampling trajectory (8). The complementary sampling strategy leads to different patterns of under-sampling artifacts among neighboring bins, which provide opportunities for the network to correct under-sampling artifacts by jointly examining neighboring bins. Step 102: The k-space data of all spectral bins is demodulated at a single center frequency so that the off-resonance induced signal displacements are the same for all bins. Step 104: Optionally, coil compression (9,10) can be applied. Step 106: The coil sensitivity maps are estimated from the fully-sampled calibration region in k-space center. If partial Fourier acquisition is used, the low-resolution image phase should be included in the sensitivity maps. Step 108: Neural network priors learned from training data as regularization are used to reduce under-sampling artifacts. In a preferred embodiment an unrolled optimization network (FIG. 2) takes k-space data and sensitivity maps of all spectral bins as input, and outputs reconstructed bin images. Since there is no under-sampling applied in the readout direction, each y-z slice can be processed by the unrolled network separately. Before input to the network, the k-space data of each scan is normalized so that the initial bin images (obtained by directly applying an inverse Fourier transform to zero-filled k-space) have an intensity range of [−1, 1]. Step 110: The spectral bins are combined with blurring correction following the same approach as in previous methods (3,11).

Unrolled Optimization Network for MSI

The unrolled optimization network in Step 108 of FIG. 1 integrates parallel imaging and partial Fourier reconstruction with CNN-based priors that exploit inter-bin correlations. The network is based on the Iterative Shrinkage-Thresholding Algorithm (ISTA) (12). Specifically, the image reconstruction problem is given by $$\min_x \|PFSx-y\|_2^2 + r(x) \qquad \text{Eq. 1}$$

where the variable x represents the images of all bins, S represents the sensitivity maps, F represents the Fourier transform, P represents the sampling mask, y represents the acquired k-space data, and r(x) is a regularization term based on prior knowledge of the images. Each iteration in ISTA includes the following two steps:

$$z^k = x^{k-1} - \frac{2}{L} S^H F^H P^H (PFSx^{k-1} - y), \qquad \text{Eq. 2.1}$$

$$x^k = \operatorname{argmin}_x \left\{ r(x) + \frac{L}{2} \|x - z^k\|_2^2 \right\}, \qquad \text{Eq. 2.2}$$

where k is the index of iterations, L is a positive parameter that can be chosen by the backtracking rule. We refer to Eq. 2.1 and Eq. 2.2 as the data-consistency update and the prior update, respectively. From an image reconstruction point of view, the data-consistency update and the prior update respectively incorporate coil sensitivity encoding and prior knowledge into the reconstruction. Eq. 2.2 can be seen the proximal operator of the regularization term r(x), which has analytical solutions for common compressed sensing priors. For example, soft thresholding is the proximal operator of the $l_1$-norm regularization $r(x)=l_1(x)$.

Rather than using hand-crafted priors such as locally low rank and sparsity for regularization, the unrolled ISTA network uses CNN-based priors that are learned from training data (7). Specifically, CNNs are used as the proximal operator in each iteration:

$$z^k = x^{k-1} - \alpha^k S^H F^H P^H (PFSx^{k-1} - y), \qquad \text{Eq. 3.1}$$

$$x^k = CNN^k(z^k), \qquad \text{Eq. 3.2}$$

where $\alpha^k$ is a scalar variable representing the step size of the data consistency update in iteration k, $CNN^k$ may be the same or different between iterations. Step size $\alpha^k$ and parameters in $CNN^k$ are learned during training. The unrolled ISTA network uses a fixed number of iterations represented by Eq. 3.1 and 3.2. Because the CNN-based priors can be more effective than hand-crafted priors, the unrolled ISTA network can converge in much fewer iterations (for example, 5 iterations) compared with conventional ISTA.

The images of the zero-filled k-space are used for initialization, $$x^0 = S^H F^H P^H y. \qquad \text{Eq. 4}$$

CNN Architecture

Figure 2:
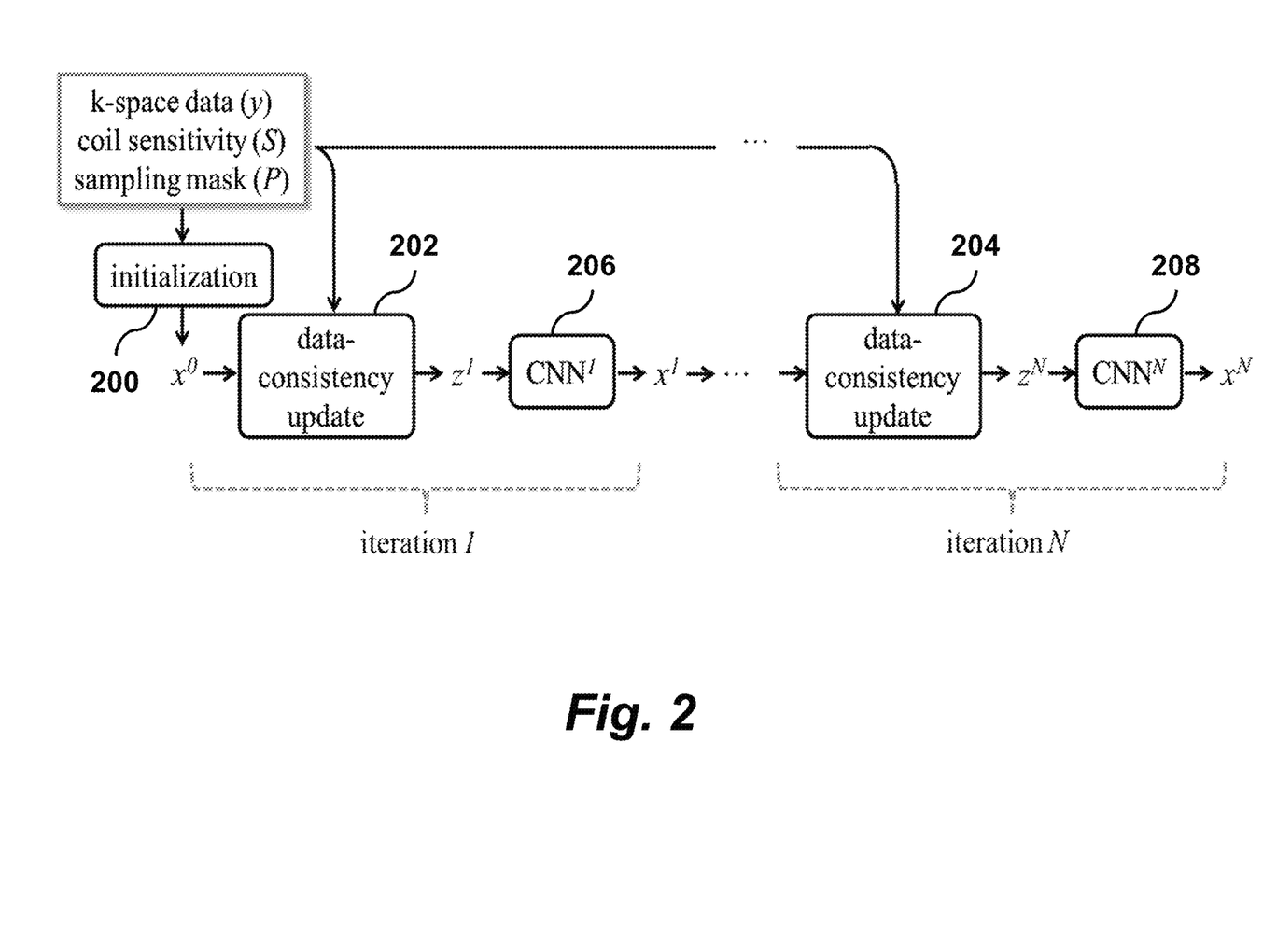
FIG. 2 is a diagram of the unrolled ISTA network, according to an embodiment of the invention.

FIG. 2 is a diagram of the unrolled ISTA network, according to an embodiment of the invention. Only the first and the last iteration is shown. The initialization step 200 is given by Eq. 4. The data-consistency updates 202, 204 are given by Eq. 3.1, which incorporates parallel imaging and partial Fourier reconstruction. The $CNN^k$ updates 206, 208 in different iterations can either be the same or different. In the unrolled ISTA network, each $CNN^k$ takes an intermediate solution $z^k$ (spectral bin images of dimension [y, z, bin]) as input and outputs images $x^k$ with under-sampling artifacts suppressed.

Figure 3:
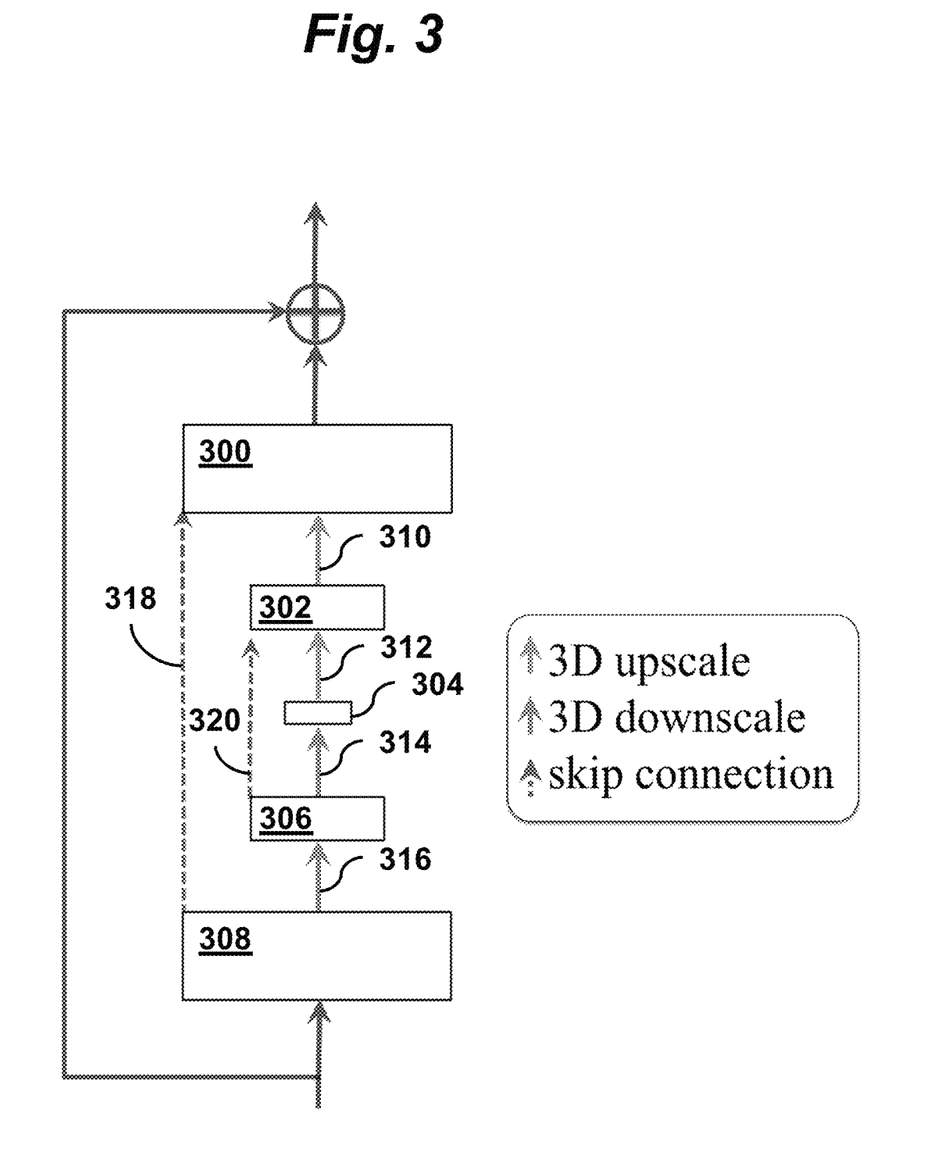
FIG. 3 is a block diagram of a 3D U-Net architecture, according to an embodiment of the invention.

A 3D U-Net architecture (13) shown in FIG. 3 is used to exploit correlations between spectral bins to suppress under-sampling artifacts using the following key features:

A residual connection (14) adds the input of the network to the output, which means the network needs to identify the artifacts in the input images, which is simpler than directly generating the underlying artifact-free images.

The 3D U-Net structure uses multiple down-sampling and up-sampling stages to identify artifacts in different spatial-spectral scales and avoids losing details by using skip connections.

Figure 4A:
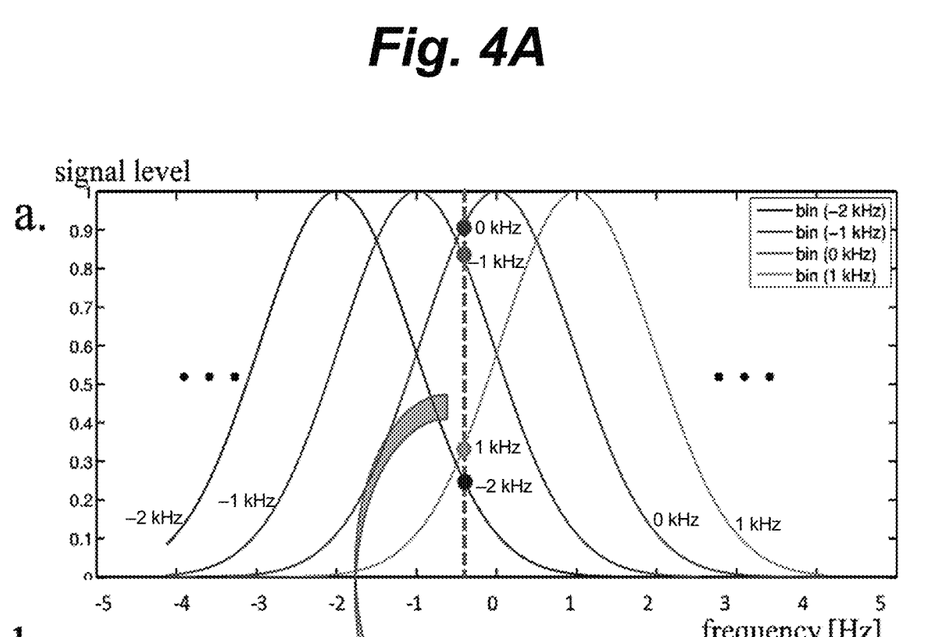
FIG. 4A-B are graphs demonstrating the locality of signals along the bin dimension, according to an embodiment of the invention.
Figure 4B:
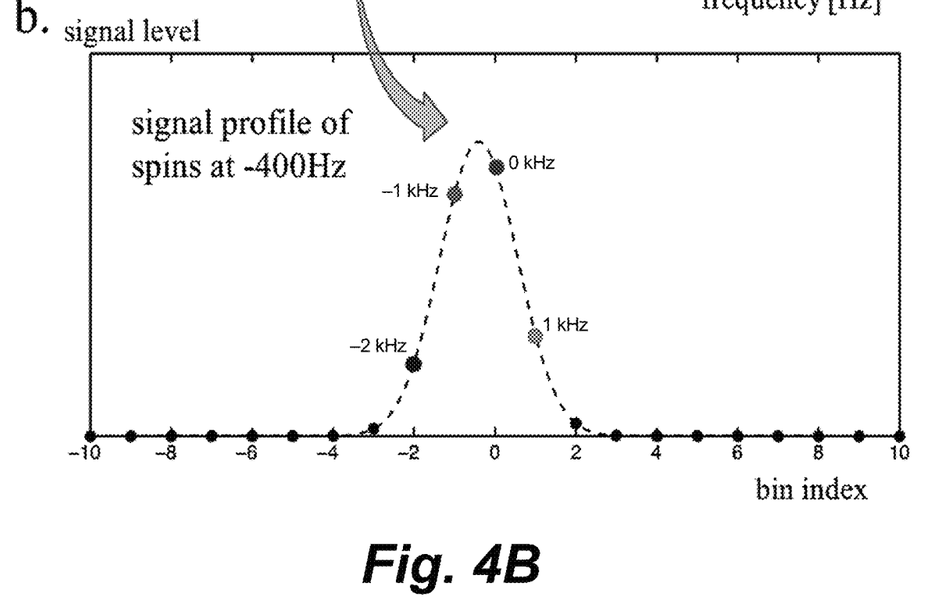

3D convolutions along y, z, and spectral bin directions are used throughout the network. As shown in FIG. 4A-B, in MSI, spins at a specific off-resonance frequency will have signal in 3 to 4 neighboring spectral bins (5), which means that images of neighboring bins have higher correlations. Performing 3D convolutions better exploits the locality of signals in the spectral dimension, compared with performing 2D convolutions along y and z directions and treating all bins equally as channels. FIG. 4A shows frequency profiles of 4 neighboring spectral bins in MAVRIC or MAVRIC-SL. The profile of each bin is a Gaussian with 2.25 kHz full width at half maximum (FWHM). The centers of different bins are separated by 1 kHz. FIG. 4B shows the signal levels of spins with −400 Hz off-resonance in different spectral bin images. The spins have signal in 4 neighboring bins, indicating the locality of signals along the bin dimension in MSI. Although this figure uses the frequency profiles of MAVRIC and MAVRIC-SL as an example, the spectral locality property also holds for other MSI techniques such as SEMAC.

The network has blocks of 3D convolutions (Conv3D) operating at different spatial-spectral scales, represented by the blocks in FIG. 3. The blocks 300, 302, 304, 306, 308 represent 3D convolutions, and the size of the blocks indicates the dimensionality of each layer in [y, z, bin] directions. Downscaling 314, 316 is done by a 3D convolution (Conv3D) of stride [2, 2, 2] in [y, z, bin] directions. Upscaling 310, 312 is done by transposed 3D convolution (ConvT3D) of stride [2, 2, 2] in [y, z, bin] directions. The skip connections 318, 320 copy the output of a previous block and concatenate it with the output of the 3D upscaling layer along channel dimension. The numbers of channels in one convolution layer are respectively 16, 32, 32, 32, 16 for the five blocks. On top of these blocks, a Conv3D layer of 1 channel is used to generate the output. The kernel size is always [3, 3, 3] for Conv3D layers, and [4, 4, 4] for ConvT3D layers. Leaky Relu is used as the activation function following all convolution (including Conv3D and ConvT3D) layers except the last one. No batch normalization is used. The network has a total of 21 convolution layers.

These specifications of the network architecture were tuned empirically considering performance, computation and amount of training data available. Increasing the complexity of the network (e.g. increasing the number of downscaling/upscaling stages and the number of channels in convolution layers) may improve the reconstruction performance but requires more computation resource and training data.

Training

The unrolled ISTA network is trained with the objective function to minimize the $l_1$-norm of the difference between the output bin images and reference bin images. Ideally, the reference bin images are from fully-sampled data, and the input to the network is retrospectively under-sampled data. However, fully-sampled data are not widely available due to prohibitively long scan times. Full k-space data synthesized from moderately-accelerated scans by conventional reconstruction methods (including parallel imaging) can be used as the reference.

Since the network processes each y-z slice independently, we can use each y-z slice as an individual sample during training. In our experiments, we found around 6,000 samples from 16 scans are enough for training the network with good generalizability. The training data can be augmented by applying different retrospective under-sampling patterns to each training sample.

The same network can process datasets of different size in x, y, z directions and different number of bins. For better efficiency, different datasets can be zero-padded to the same size in k-space during training.

The deep-learning-based MSI reconstruction technique can be applied to accelerate acquisitions of both slice-selective and non-slice-selective MSI sequences, including SEMAC (1), MAVRIC (2) and MAVRIC-SL (3) (Product versions of these methods include Advanced WARP, O-MAR XD, and MAVRIC-SL on different vendors). It can also be used to improve the spatial resolution and signal-to-noise ratio of 2D MSI (15), which is a fast 2D method for imaging near metal.

Partial Fourier (PF) reconstruction and parallel imaging (PI) (16,17) are routinely used in MSI scans, offering a 4-7 fold acceleration. These methods can be realized with non-iterative algorithms and have high computation efficiency, but their acceleration factors are limited. Compressed sensing (CS) can be combined with PF and/or PI (18,19) for higher acceleration, while it requires iterative algorithms and thus increases computation time. Model-based reconstruction (5) and RPCA (6) exploit the correlations between spectral bins and demonstrates significantly better performance than bin-by-bin CS at 20-fold acceleration. However, they require even more reconstruction time and memory than bin-by-bin CS since the reconstruction of all spectral bins are coupled. Based on our experience, both model-based reconstruction and RPCA take around 1 hour for a typical hip MAVRIC-SL scan using 20 CPUs (Intel Xeon, 2.30 GHz). The computation time may be reduced by using GPUs or further optimizing the parallelization scheme, but both methods still require 100-200 iterations with 2D FFTs in each iteration. The DL-based MSI reconstruction has an advantage in computation efficiency, because it requires much fewer iterations and can exploit the highly-optimized implementation from existing frameworks such as TensorFlow. Our current implementation takes around 2 minutes for a typical hip scan with 1 GPU (Nvidia Titan Xp). The computation time may be further reduced by using multiple GPUs, improving the efficiency of data I/O or using more efficient network architectures (detailed in variation 5 discussed below).

In addition to the advantages in computation efficiency, the DL-based reconstruction also shows improved image quality in preliminary results compared with existing methods.

The DL-based reconstruction was trained and tested with MAVRIC-SL proton-density-weighted scans of 35 volunteers (16 for training, 19 for test) with total-hip-replacement implants. 16 training datasets provide a total of 6144 samples. All scans were performed on GE 3T MRI systems with 24 spectral bins, 2×2 uniform under-sampling and half-Fourier acquisition (under-sampling factor R=7). Other parameters include 32-channel torso array, matrix size: 384×256×(24-40), voxel size: 1.0 mm×1.6 mm×4.0 mm. The images reconstructed by bin-by-bin PICS using all acquired data used as the reference.

The k-space is under-sampled with variable-density complementary Poisson-disc (CPD) sampling with fully-sampled calibration region of size 20×12 for coil sensitivity calibration (R=18-23 for datasets that have 24-40 slices).

The DL-based reconstruction was compared with RPCA. We used reconstruction parameters suggested in (6), including a calibration-less variable-density CPD sampling pattern (R=18 for all cases). We also tested RPCA with the same sampling pattern as the deep-learning-based reconstruction (with calibration region) and found the performance was degraded. Images were evaluated with normalized root-mean-square error (nRMSE) and structural similarity index (SSIM) (20).

Figure 5:
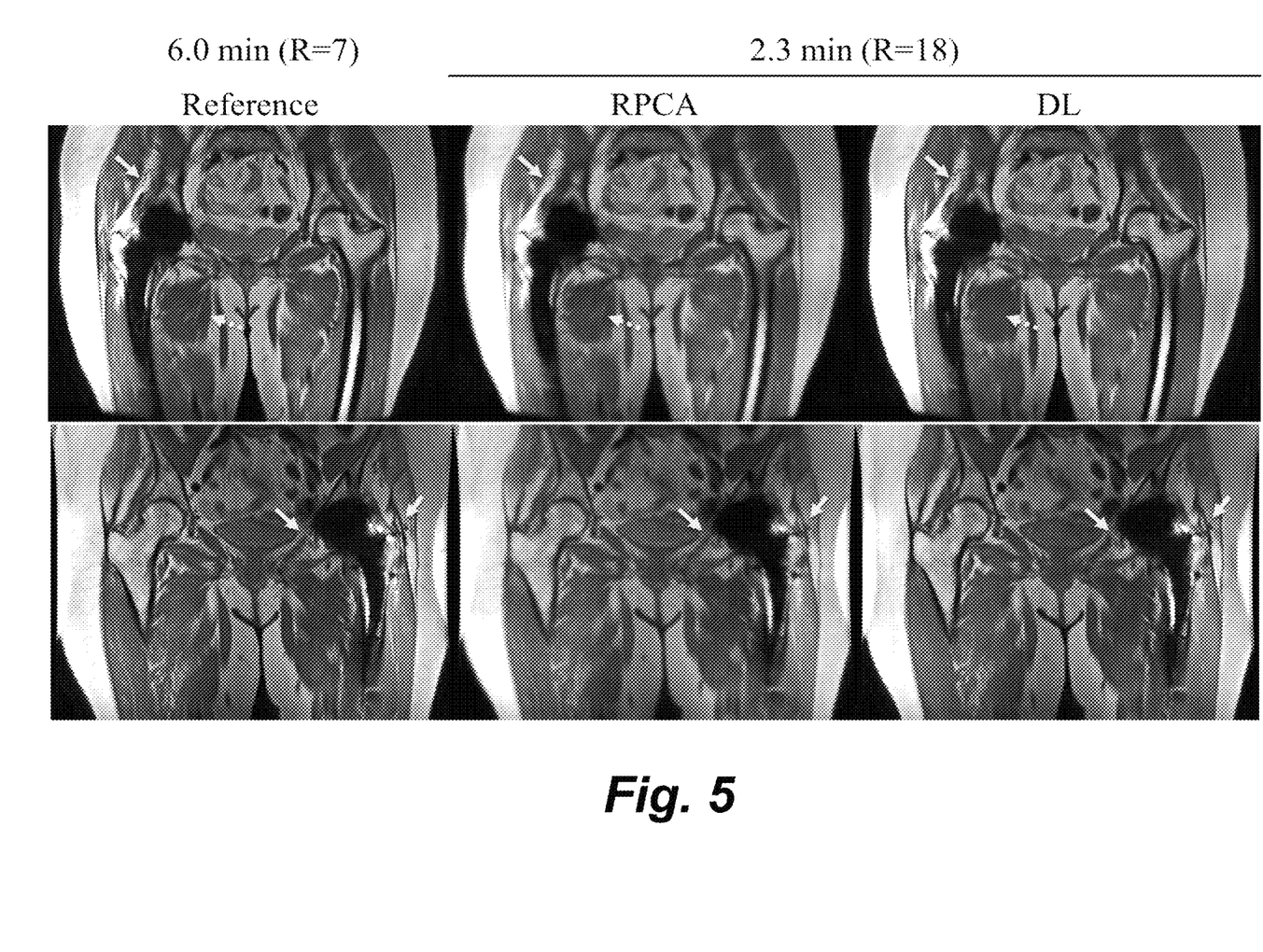
FIG. 5 is an array of images showing results of the deep-learning-based reconstruction technique in two volunteers with total hip replacements, according to an embodiment of the invention.

The results of two test cases are given in FIG. 5. The deep-learning-based reconstruction (labeled as DL) results appear similar to the reference images and show sharper details (solid arrows) compared with RPCA. The dashed arrows point to areas where the DL-based reconstruction suppressed some structures that have low contrast from surroundings in muscle. These structures usually have low contrast from their surroundings, which might cause them to be misidentified as artifacts by the network. This may be avoided by increasing the number of training samples/datasets to reduce overfitting and/or by improving the choice of loss function in training.

For quantitative evaluation, the DL-based reconstruction reduced nRMSE from 9.8% to 7.1%, and increased SSIM from 0.94 to 0.96 in average across the 19 test cases.

Other embodiments of the invention are envisioned, some of which include the following:
- The approach described above can be used with or without parallel imaging (PI) or partial Fourier sampling (PF). In most cases, combining DL-based reconstruction with PI or PF can increase the total acceleration factor. However, in cases of single-receiver channels, PI is not applicable. In other cases, PF may not be desired as it can lead to blurring.
- The implementation described above integrates the CNN priors with SENSitivity Encoding (SENSE), a parallel imaging technique that requires coil sensitivity maps. The coil sensitivity maps can be obtained from fully-sampled calibration regions or from a separate calibration scan. SENSE is susceptible to phase wrap-around artifacts, when the dimensionality of an object exceeds the defined FOV in a phase-encoding direction. To avoid phase wrap-around artifacts, a soft SENSE reconstruction (21) that uses multiple sets of coil sensitivities can be used in the unrolled optimization network. Another method that is robust against phase wrap-around artifacts is Calibration-free Locally low-rank Encouraging Reconstruction (CLEAR) (22), which also eliminates the need for calibration signals for even higher acceleration. The unrolled optimization network can be modified to use CLEAR for PI.

The described unrolled optimization network minimizes the objective function (Eq. 1) that has a data-consistency term and a CNN-based prior term. Other prior terms, including CNN-based priors that operate on individual bins and conventional priors (e.g. sparsity, locally low-rank), can be added to the objective to improve reconstruction performance.

The described unrolled optimization network is based on ISTA, which can be replaced by other optimization algorithms. For example, the alternating direction method of multipliers (ADMM) (23) can be used to allow CLEAR or additional prior terms as described above in 1 and 2.

The network can be trained with other metrics of the difference between the reference and the output, including $l_2$-norm of the difference, SSIM (20), perception loss (24) and adversarial loss (25). It may be helpful to use a combination of several metrics.

There can be variations on the architecture of the CNNs. Similar to the idea in depth-wise separable convolutions (26), we can separate one 3D convolution layer into one 2D convolution along y, z directions and one 1D convolution along the bin direction for better computation efficiency. The architecture also depends on the patterns of under-sampling artifacts, which depends on the point spread functions (PSF) of k-space sampling patterns. The largest receptive field of neurons in the network should cover the largest distance between the main-lobe and major side-lobes of the PSF. If uniform under-sampling is applied, the network should have neurons of large receptive field to identify coherent aliasing artifacts within the FOV. In this case, U-Nets with more down-sampling steps or even network architectures with fully-connected layers should be used.

The CNN priors can take different input. Rather than taking y-z slices coil-combined bin images, the CNNs can take multi-coil bin images to utilize the coil sensitivity encoding. The CNNs may also take several neighboring y-z slices together as input to utilize the correlations along the readout direction.

REFERENCES

1. Lu W, Pauly K B, Gold G E, Pauly J M, Hargreaves B A. SEMAC: slice encoding for metal artifact correction in MRI. Magnetic Resonance in Medicine 2009; 62(1):66-76.
2. Koch K M, Lorbiecki J E, Hinks R S, King K F. A multispectral three-dimensional acquisition technique for imaging near metal implants. Magnetic Resonance in Medicine 2009; 61(2):381-390.
3. Koch K, Brau A, Chen W, Gold G, Hargreaves B, Koff M, McKinnon G, Potter H, King K. Imaging near metal with a MAVRIC-SEMAC hybrid. Magnetic Resonance in Medicine 2011; 65(1):71-82.
4. Smith M R, Artz N S, Koch K M, Samsonov A, Reeder S B. Accelerating sequences in the presence of metal by exploiting the spatial distribution of off-resonance. Magnetic resonance in medicine 2014; 72(6):1658-1667.
5. Shi X, Levine E G, Hargreaves B A. Accelerated Imaging of Metallic Implants Using Model-Based Nonlinear Reconstruction 2016; Singapore. p 47.
6. Levine E, Stevens K, Beaulieu C, Hargreaves B. Accelerated three-dimensional multispectral MRI with robust principal component analysis for separation of on- and off-resonance signals. Magnetic resonance in medicine 2018; 79(3):1495-1505.
7. Diamond S, Sitzmann V, Heide F, Wetzstein G. Unrolled Optimization with Deep Priors. arXiv preprint arXiv: 170508041 2017.
8. Levine E, Daniel B, Vasanawala S, Hargreaves B, Saranathan M. 3D Cartesian MRI with compressed sensing and variable view sharing using complementary Poisson-disc sampling. Magnetic resonance in medicine 2016.
9. Buehrer M, Pruessmann K P, Boesiger P, Kozerke S. Array compression for MRI with large coil arrays. Magnetic Resonance in Medicine 2007; 57(6):1131-1139.
10. Zhang T, Pauly J M, Vasanawala S S, Lustig M. Coil compression for accelerated imaging with Cartesian sampling. Magnetic resonance in medicine 2013; 69(2):571-582.
11. Quist B, Shi X, Weber H, Hargreaves B A. Improved field-mapping and artifact correction in multispectral imaging. Magnetic resonance in medicine 2017; 78(5): 2022-2034.
12. Beck A, Teboulle M. A fast iterative shrinkage-thresholding algorithm for linear inverse problems. SIAM journal on imaging sciences 2009; 2(1):183-202.
13. Çiøek Ö, Abdulkadir A, Lienkamp S S, Brox T, Ronneberger O. 3D U-Net: learning dense volumetric segmentation from sparse annotation. 2016. Springer. p 424-432.
14. He K, Zhang X, Ren S, Sun J. Deep residual learning for image recognition. 2016. p 770-778.
15. Hargreaves B A, Taviani V, Litwiller D V, Yoon D. 2D multi-spectral imaging for fast MRI near metal. Magnetic resonance in medicine 2018; 79(2):968-973.
16. Chen W, Beatty P, Koch K, Brau A. Parallel MRI near metallic implants. 2009; Montreal. p 2783.
17. Hargreaves B A, Chen W, Lu W, Alley M T, Gold G E, Brau A, Pauly J M, Pauly K B. Accelerated slice encoding for metal artifact correction. Journal of Magnetic Resonance Imaging 2010; 31(4)987-996.
18. Worters P W, Sung K, Stevens K J, Koch K M, Hargreaves B A. Compressed-Sensing multispectral imaging of the postoperative spine. Journal of Magnetic Resonance Imaging 2013; 37(1):243-248.
19. Otazo R, Nittka M, Bruno M, Raithel E, Geppert C, Gyftopoulos S, Recht M, Rybak L. Sparse-SEMAC: rapid and improved SEMAC metal implant imaging using SPARSE-SENSE acceleration. Magnetic Resonance in Medicine 2017; 78(1):79-87.
20. Wang Z, Bovik A C, Sheikh H R, Simoncelli E P. Image quality assessment: from error visibility to structural similarity. IEEE transactions on image processing 2004; 13(4):600-612.
21. Uecker M, Lai P, Murphy M J, Virtue P, Elad M, Pauly J M, Vasanawala S S, Lustig M. ESPIRiT-an eigenvalue approach to autocalibrating parallel MRI: where SENSE meets GRAPPA. Magnetic resonance in medicine 2014; 71(3):990-1001.
22. Trzasko J D, Manduca A. Calibrationless parallel MRI using CLEAR. 2011. IEEE. p 75-79.
23. Boyd S, Parikh N, Chu E, Peleato B, Eckstein J. Distributed optimization and statistical learning via the alternating direction method of multipliers. Foundations and Trends® in Machine learning 2011; 3(1):1-122.
24. Johnson J, Alahi A, Fei-Fei L. Perceptual losses for real-time style transfer and super-resolution. 2016. Springer. p 694-711.
25. Ledig C, Theis L, Huszár F, Caballero J, Cunningham A, Acosta A, Aitken A, Tejani A, Totz J, Wang Z. Photo-realistic single image super-resolution using a generative adversarial network. arXiv preprint 2016.
26. Chollet F. Xception: Deep learning with depthwise separable convolutions. arXiv preprint 2016.

The invention claimed is:

1. A method for magnetic resonance imaging that reconstructs images having reduced under-sampling artifacts, the method comprising:

performing by a magnetic resonance imaging (MRI) apparatus an accelerated multi-spectral imaging (MSI) acquisition within a field of view of the MRI apparatus to produce under-sampled k-space data;

reconstructing from the under-sampled k-space data bin images using neural network priors learned from training data as regularization to reduce under-sampling artifacts; and combining the reconstructed bin images to form a final image.

2. The method of claim 1 wherein an unrolled optimization algorithm is used to incorporate the neural network priors as regularization.

3. The method of claim 2 wherein the unrolled optimization algorithm is implemented using Iterative Shrinkage-Thresholding Algorithm (ISTA), alternating direction method of multipliers (ADMM), or a gradient descent algorithm.

4. The method of claim 1 wherein 3D convolutional neural networks (CNN) are used as the neural network priors.

5. The method of claim 4 wherein the 3D convolutional neural network (CNN) has convolutions along spatial and spectral dimensions.

* * * * *